United States Patent
Yang et al.

(10) Patent No.: US 8,248,089 B2
(45) Date of Patent: Aug. 21, 2012

(54) APPARATUS FOR TESTING A SEMICONDUCTOR DEVICE

(75) Inventors: JaeHyun Yang, Yongin-si (KR); Soomin Byun, Gyeonggi-do (KR); Kunhyung Lee, Hwaseong-si (KR); Ji-Young Son, Gimcheon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 262 days.

(21) Appl. No.: 12/656,588

(22) Filed: Feb. 4, 2010

(65) Prior Publication Data

US 2010/0207653 A1   Aug. 19, 2010

(30) Foreign Application Priority Data

Feb. 17, 2009  (KR) .................. 10-2009-0013021

(51) Int. Cl.
*G01R 31/00* (2006.01)
(52) U.S. Cl. ......... 324/750.03; 324/750.11; 324/750.07; 324/750.01
(58) Field of Classification Search ............. 324/750.28, 324/750.09, 750.08, 750.11, 750.04
See application file for complete search history.

(56) References Cited

U.S. PATENT DOCUMENTS

| | | | | |
|---|---|---|---|---|
| 3,635,037 A * | 1/1972 | Hubert | ............................ | 62/3.2 |
| 5,198,752 A * | 3/1993 | Miyata et al. | ............ | 324/750.08 |
| 6,181,145 B1 * | 1/2001 | Tomita et al. | ............ | 324/750.03 |
| 7,296,417 B2 * | 11/2007 | Ghoshal | .......................... | 62/3.7 |
| 7,299,639 B2 * | 11/2007 | Leija et al. | ...................... | 62/3.2 |
| 7,394,271 B2 * | 7/2008 | Lopez et al. | ............. | 324/750.03 |
| 7,421,845 B2 * | 9/2008 | Bell | ................................ | 62/3.2 |
| 7,456,641 B2 | 11/2008 | Bae et al. | | |
| 7,495,458 B2 * | 2/2009 | McClanahan et al. | ... | 324/750.03 |
| 7,946,120 B2 * | 5/2011 | Bell et al. | ......................... | 62/3.7 |
| 2007/0132469 A1 * | 6/2007 | Yano | ............................. | 324/760 |
| 2008/0116925 A1 * | 5/2008 | Sunohara et al. | ............. | 324/761 |

FOREIGN PATENT DOCUMENTS

| | | |
|---|---|---|
| JP | 11-026523 A | 1/1999 |
| JP | 2007-033450 A | 2/2007 |
| KR | 10-2006-0011792 A | 2/2006 |
| KR | 10-2007-0013041 A | 1/2007 |

* cited by examiner

Primary Examiner — Richard Isla Rodas
(74) Attorney, Agent, or Firm — Lee & Morse, P.C.

(57) ABSTRACT

An apparatus for testing an electrical property of a semiconductor device includes a substrate support unit, a tester head above the substrate support unit, the tester head including a base, a probe card connected to the base of the tester head, and a temperature control unit within the base of the tester head, the temperature control unit being configured to control temperature of the probe card by heat transfer with the probe card.

12 Claims, 9 Drawing Sheets

APPARATUS FOR TESTING A SEMICONDUCTOR DEVICE

BACKGROUND

1. Field

Example embodiments relate to an apparatus for testing a semiconductor device. More particularly, example embodiments relate to an apparatus for testing electrical properties of a semiconductor device.

2. Description of the Related Art

In general, a semiconductor manufacturing process may include, e.g., a fabrication (FAB) process, an electric die sorting (EDS) process, and an assembly process. For example, a plurality of semiconductor devices may be formed on a wafer in the FAB process. Electrical properties of each semiconductor device formed in the FAB process may be tested through the EDS process. In the assembly process, non-defective devices determined through the EDS process may be individually separated, and then, packaged to protect their electrical and physical properties against mechanical, physical, and/or chemical impacts applied from the outside.

Among the above processes, the EDS process is performed to determine whether each semiconductor device formed on the wafer operates properly, e.g., by an electrical test for detecting defective devices. That is, an electrical signal may be transmitted to each semiconductor device formed on the wafer, followed by checking the transmitted electrical signal in order to determine whether each semiconductor device operates properly, e.g., determine defective devices.

Since each of the semiconductor devices formed on the wafer is very small in size, it may be difficult to directly connect a tester generating electrical signals to each semiconductor device. Thus, a probe card including a plurality of probe needles may be disposed, as an intermediary, between the tester generating the electrical signals and the wafer including the devices. The tester may generate the electrical signals for testing the semiconductor devices, i.e., chips to transmit the generated electrical signals to the probe card. Thereafter, the probe card may transmit the electrical signals to each semiconductor device through the probe needles.

SUMMARY

Embodiments are directed to an apparatus for testing electrical properties of a semiconductor device, which substantially overcomes one or more of the problems due to the limitations and disadvantages of the related art.

It is therefore a feature of an embodiment to provide an apparatus for testing electrical properties of a semiconductor device with a temperature control unit in order to improve process efficiency.

At least one of the above and other features and advantages may be realized by providing an apparatus for testing electrical properties of a semiconductor device, including a substrate support unit on which a substrate is placed, a tester head disposed above the substrate support unit, the tester head including a base to which a probe card is connected, and a temperature control unit disposed within the base of the tester head, the temperature control unit controlling a temperature of the probe card by heat transfer with the probe card.

In some exemplary embodiments, the temperature control unit may include a thermoelectric module in which a heat flow direction is changed according to a power flow direction, the thermoelectric module being disposed within the base to heat-transfer with the probe card, and a plate disposed on a top surface of the thermoelectric module, the plate radiating or absorbing heat according to a change of the heat flow direction of the thermoelectric module.

In other exemplary embodiments, the temperature control unit may include a temperature detector disposed within the base to detect the temperature of the probe card, and a controller generating a control signal corresponding to a detection signal of the temperature detector and applying the control signal to a power supply of the thermoelectric module to change a power flow direction of the power supply.

In still other exemplary embodiments, the temperature control unit may further include a housing receiving the thermoelectric module, the plate, and the temperature detector.

In even other exemplary embodiments, an elastic member may be disposed between the base and the housing to apply an elastic force which pushes down the housing.

In yet other exemplary embodiments, the temperature control unit may further include blow fans disposed above the plate, and an exhaust hole exhausting air blown by the blow fans may be formed in the housing.

In further exemplary embodiments, a cooling line through which a coolant flows may be formed within the plate.

In still further embodiments, the temperature control unit may further include a cooling air supply member supplying cooling air into the housing, and an exhaust hole exhausting the cooling air supplied into the housing may be formed in the housing.

In even further exemplary embodiments, a plurality of grooves may be formed in a top surface of the plate to increase an area which contacts with an air.

In yet further exemplary embodiments, the base may have a cylindrical shape having an opened lower portion, and the probe card may be coupled to the base to close the opened lower portion of the base, wherein the temperature control unit may include a housing disposed within the base to contact a top surface of the probe card, a thermoelectric module in which a heat flow direction is changed according to a power flow direction, the thermoelectric module being disposed on a bottom surface of the housing, a plate disposed on a top surface of the thermoelectric module, the plate radiating or absorbing heat according to a change of the heat flow direction of the thermoelectric module, a temperature detector detecting a temperature of a lower wall of the housing contacting with the probe card, and a controller generating a control signal corresponding to a detection signal of the temperature detector and applying the control signal to a power supply of the thermoelectric module to change a power flow direction of the power supply.

The temperature control unit may be enclosed between the probe card and the base of the tester head. The probe card and the base of the tester head may be coupled to each other to define a volumetric space therebetween, the temperature control unit being entirely within the volumetric space. The temperature control unit may be in a housing, the housing being enclosed in the volumetric space, and a bottom wall of the housing being flush with the probe card. A portion of the probe card may be in the volumetric space, the portion of the probe card contacting the temperature control unit. The temperature control unit may include a thermoelectric module configured to change a heat flow direction according to a power flow direction, and a temperature detector configured to detect the temperature of the probe card, the temperature detector and the thermoelectric module being positioned directly on a same surface. The temperature detector may be configured to directly measure a temperature of a surface which directly contacts the thermoelectric module.

BRIEF DESCRIPTION OF THE DRAWINGS

The above and other features and advantages will become more apparent to those of ordinary skill in the art by describing in detail exemplary embodiments with reference to the attached drawings, in which.

DETAILED DESCRIPTION

Figure 1:
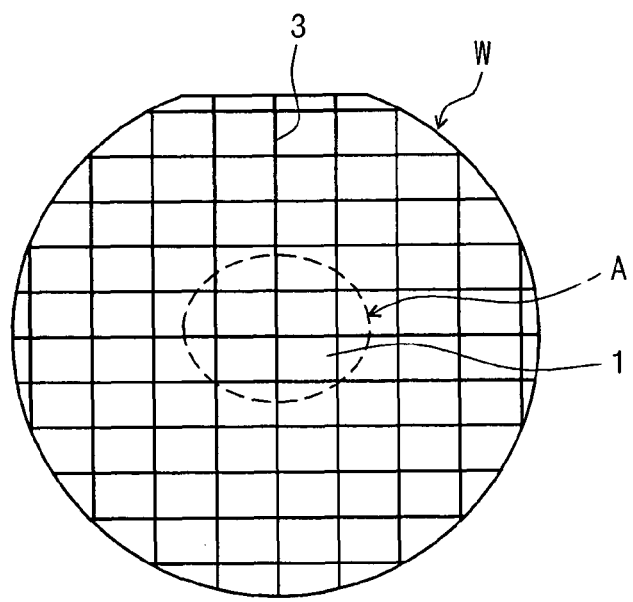
FIG. 1 illustrates a schematic view of a wafer including semiconductor devices.

Korean Patent Application No. 10-2009-0013021, filed on Feb. 17, 2009, in the Korean Intellectual Property Office, and entitled: "Apparatus of Testing Semiconductor Device," is incorporated by reference herein in its entirety.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the invention to those skilled in the art.

In the drawing figures, the dimensions of layers and regions may be exaggerated for clarity of illustration. It will also be understood that when an element or layer is referred to as being "on" another element or substrate, it can be directly on the other element or substrate, or intervening elements may also be present. Further, it will be understood that when an element is referred to as being "above" or "below" another element, it can be directly above/below, or one or more intervening elements may also be present. In addition, it will also be understood that when an element is referred to as being "between" two elements, it can be the only element between the two elements, or one or more intervening elements may also be present. Like reference numerals refer to like elements throughout.

Figure 2:
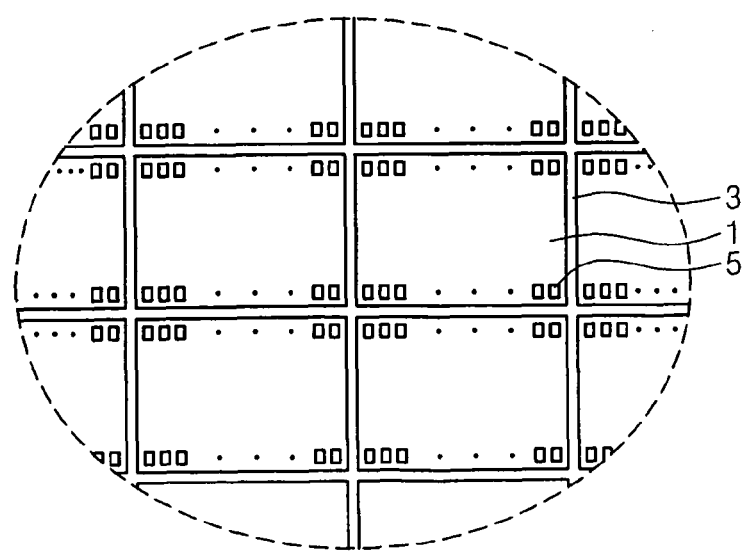
FIG. 2 illustrates an enlarged view of a portion "A" in FIG. 1.

FIG. 1 illustrates a view of a wafer including semiconductor devices, and FIG. 2 illustrates an enlarged view of a portion "A" in FIG. 1. Referring to FIGS. 1 and 2, a plurality of semiconductor devices 1 may be formed on a wafer W through a fabrication (FAB) process. The semiconductor devices 1 may be separated by scribe lines 3, and may be manufactured into unit chips through an assembly process.

An electric die sorting (EDS) process for testing electrical properties of the semiconductor devices 1 formed on the wafer W may be performed between the FAB process and the assembly process. In the EDS process, electrical signals may be applied to electrode pads 5 disposed along a periphery of the semiconductor devices 1 formed on the wafer W to check the applied electrical signals, thereby determining electrical operation of the semiconductor devices 1, e.g., whether the semiconductor devices 1 are defective.

Figure 3:
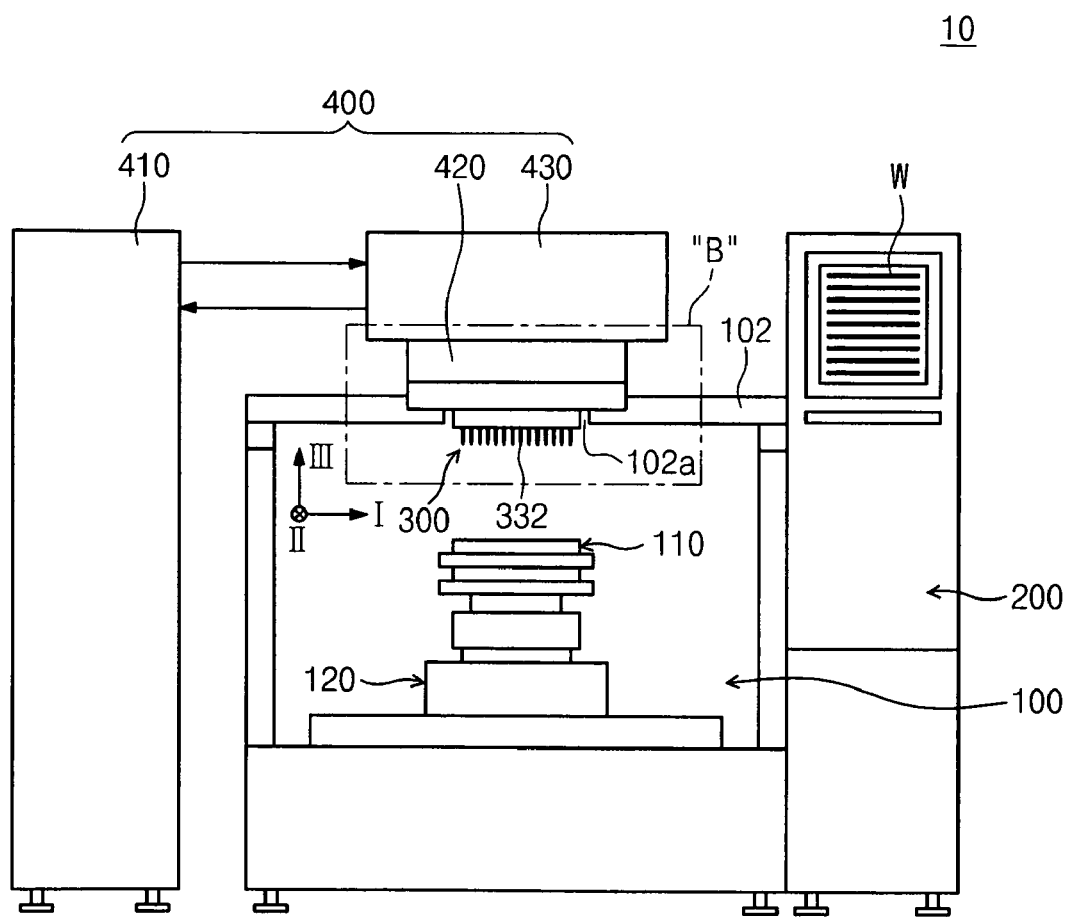
FIG. 3 illustrates a schematic view of an apparatus for testing semiconductor devices according to an exemplary embodiment.

Hereinafter, an apparatus for testing semiconductor devices in an EDS process according to example embodiments will be described. FIG. 3 illustrates a schematic view of an apparatus for testing semiconductor devices according to the exemplary embodiment. Referring to FIG. 3, an apparatus 10 for testing semiconductor devices may include a probe chamber 100, a load chamber 200, a probe card 300, and a tester 400.

The probe chamber 100 may provide a space in which an EDS process for testing electrical properties of the semiconductor devices is performed. The load chamber 200 may be disposed adjacent to a side, e.g., a first side, of the probe chamber 100. The load chamber 200 may receive a wafer W to be tested, and may transfer the wafer W into the probe chamber 100.

The probe card 300 may be disposed in a hole 102a formed in an upper wall 102 of the probe chamber 100. A substrate support unit 110 may be disposed inside the probe chamber 100 to face the probe card 300. The wafer W transferred from the load chamber 200 may be mounted on the substrate support unit 110.

The substrate support unit 110 may be disposed on a transfer member 120. The transfer member 120 may move the substrate support unit 110 in horizontal directions I and II and in a vertical direction III. In addition, the transfer member 120 may rotate the substrate support unit 100 with respect to a central axis perpendicular to a surface of the wafer W. The horizontal directions I and II represent directions in which the semiconductor devices are arranged on the surface of the wafer W. The vertical direction represents a direction perpendicular to the surface of the wafer W.

When the substrate support unit 110 is rotated by the transfer member 120, the electrode pads 5 of the semiconductor devices 1 formed on the wafer W may be aligned to correspond to an arrangement of probe needles 332 of the probe card 300. When the substrate support unit 100 is moved horizontally, i.e., along directions I and/or II, by the transfer member 120, the electrode pads 5 of the semiconductor devices 1 formed on the wafer W may be vertically aligned with the probe needles 332 of the probe card 300. When the substrate support unit 100 is moved vertically, i.e., along direction III, by the transfer member 120, the electrode pads 5 of the semiconductor devices 1 formed on the wafer W may be moved to physically contact the probe needles 332 of the probe card 300.

The tester 400 may include a tester body 410 on the other side, e.g., on a second side opposite the first side, of the probe chamber 100, and a tester head 430 electrically connected to the tester body 410. The tester head 430 may include a base 420 to which the probe card 300 is connected. The tester body 410 may apply electrical signals to the probe card 300 via the tester head 430 and the base 420 in order to test the semiconductor devices 1, and may receive signals checked through the applied electrical signals from the probe card 300, thereby determining whether the semiconductor devices 1 are defective.

Figure 4:
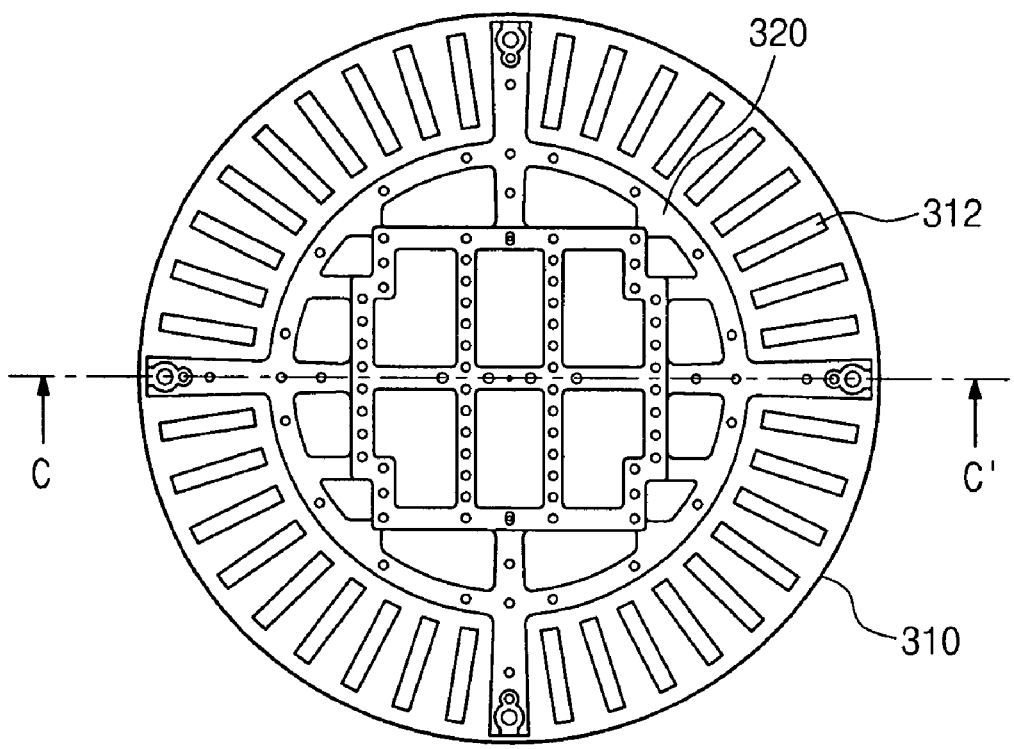
FIG. 4 illustrates a plan view of a probe card in FIG. 3.
Figure 5:
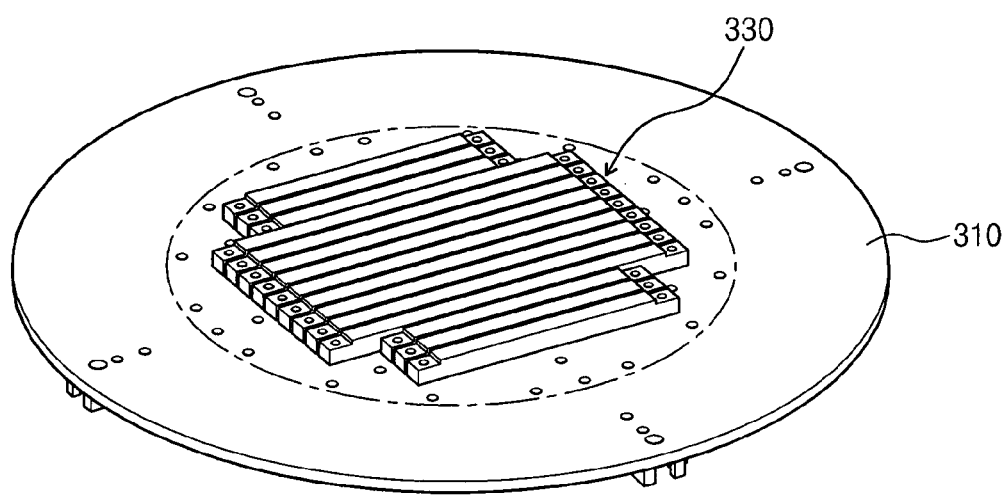
FIG. 5 illustrates a bottom perspective view of the probe card in FIG. 3.
Figure 6:
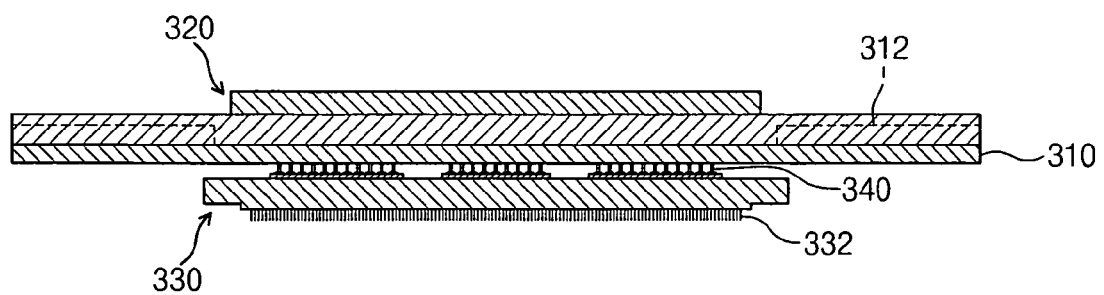
FIG. 6 illustrates a sectional view taken along line C-C' in FIG. 4.

FIG. 4 illustrates a plan view of the probe card 300 in FIG. 3, FIG. 5 illustrates a bottom perspective view of the probe card 300 in FIG. 3, and FIG. 6 illustrates a sectional view along line C-C' of FIG. 4.

Referring to FIGS. 4 through 6, the probe card 300 may include a main circuit board 310 having a disk shape. A reinforcement member 320 may be disposed on a top surface of the main circuit board 310 to prevent the main circuit board 310 from being bent or twisted. Connectors 312 may be disposed along a circumference of the top surface of the main circuit board 310.

As illustrated in FIG. 5, probe blocks 330 may be disposed on a bottom surface of the main circuit board 310. The probe blocks 330 may have a bar shape, and may be configured to receive all rows or columns of the semiconductor devices 1 formed on the wafer W. The probe blocks 330 may be connected to the main circuit board 310 by interposers 340. The probe needles 332 physically contacting the electrode pads 5 of the semiconductor devices 1 to be tested may be coupled to bottom surfaces of the probe blocks 330.

Figure 7:
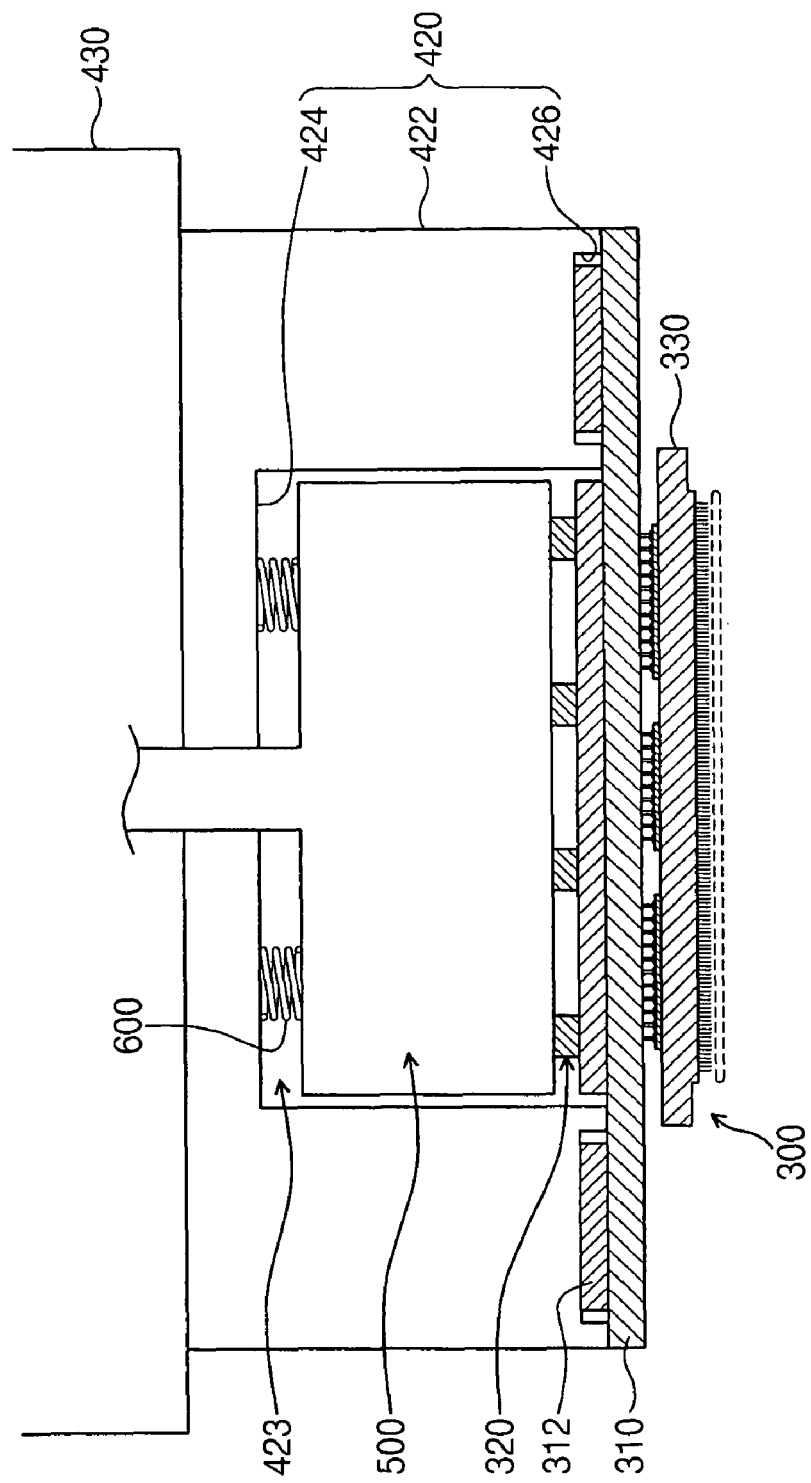
FIG. 7 illustrates an enlarged view of a portion "B" in FIG. 3.

FIG. 7 illustrates an enlarged view of a portion "B" of FIG. 3.

Referring to FIG. 7, the base 420 may have, e.g., a cylindrical shape, and may include an open lower portion. For example, the base 422 may include an upper wall 424 on the tester head 430 and a sidewall 422 extending from the upper wall 424 in a downward direction. A space 423 may be defined by the upper wall 424 and the sidewalls 422, i.e., the open lower portion. Connectors 426 may be disposed on a bottom surface of the sidewall 422, i.e., a surface facing away from the upper wall 424. The connectors 426 of the base 420 and the connectors 312 of the probe card 300 may be provided in a male/female pair. The probe card 300 may be coupled to the base 420 to close the open lower portion of the base 420, i.e., to close the space 423. The connectors 312 of the probe card 300 may be coupled to the connectors 426 of the base 420.

The substrate support unit 110 (FIG. 3) may be moved toward the probe card 300 by the transfer member 120 (FIG. 3) in a state where the probe card 300 is coupled to the base 420 of the tester head 430. Then, the electrode pads 5 of the semiconductor devices 1 formed on the wafer W and placed on the substrate support unit 110 may contact the probe needles 332 of the probe card 300 to perform the EDS process for testing the electrical properties of the semiconductor devices 1.

In the EDS process, the wafer W may be tested under temperature conditions varying from about (−20)° C. to about 90° C. When the semiconductor devices 1 are tested under low and high temperature conditions, operation reliability may be improved.

In order to maintain the probe card 300 at a substantially constant temperature during the EDS process, the apparatus for testing the semiconductor devices 1 according to example embodiments may include a temperature control unit 500. Since the temperature control unit 500 maintains the probe card 300 at a substantially constant temperature, deformation, e.g., shrinking, of the probe card 300 and the probe needles 332 under low temperature condition may be prevented or substantially minimized. Similarly, the temperature control unit 500 may prevent or substantially minimize deformation, e.g., twisting and/or bending, of the probe card 300 and the probe needles 332 under high temperature condition. When deformation of the probe card 300 and the probe needles 332 is prevented, positions of the probe needles 322 corresponding to the electrode pads 5 of the semiconductor devices 1 may be unchanged, thereby providing reliable electrical connections therebetween, i.e., contact points of the probe needles contacting the electrode pads, and efficient operability, i.e., proper determination regarding non-operable chips. In contrast, when positions of the probe needles are changed due to deformation, contact points of the probe needles contacting the electrode pads may be changed to misjudge non-defective chips as defective chips.

The temperature control unit 500 may be disposed within the base 420 of the tester head 430. Specifically, the temperature control unit 500 may be disposed within the space 423 defined by the sidewall 422 and the upper wall 424 of the base 420. An elastic member 600 may be disposed between the temperature control unit 500 and the upper wall 424 of the base 420 to provide an elastic force in a vertical direction.

When the connectors 312 of the probe card 300 are coupled to the connectors 426 of the base 420, an upper portion of the probe card 300, i.e., the reinforcement member 320, may push up the temperature control unit 500. When the temperature control unit 500 is pushed up within the base 420, i.e., against the elastic member 600, the elastic member 600 may be compressed. The compressed elastic member 600 may apply an elastic force in a downward direction, i.e., to the temperature control unit 500, to push down the temperature control unit 500, thereby closely attaching the temperature control unit 500 to the reinforcement member 320. In other words, when the connectors 312 of the probe card 300 are coupled to the connectors 426 of the base 420, a bottom surface of the temperature control unit 500 may be closely pressed against an upper surface of the reinforcement member 320 of the probe card 300 to have no space therebetween. In this state, the temperature control unit 500 may be enclosed, e.g., completely enclosed, between the base 420 and the probe card 300, and may control a temperature of the probe card 300 through heat transfer with the reinforcement member 320 of the probe card 300, as will be discussed in more detail below with reference to FIGS. 8-9B.

Figure 8:
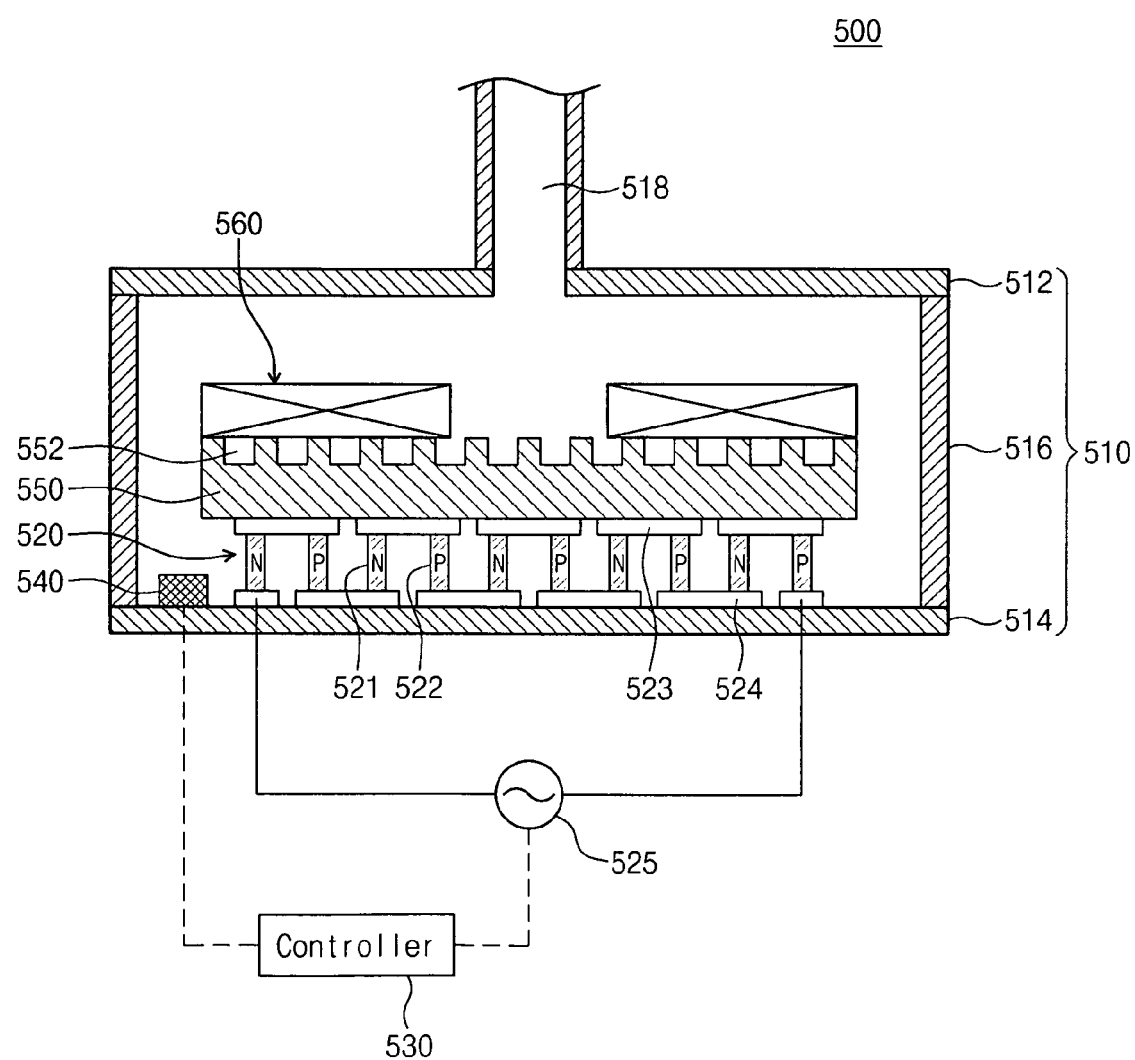
FIG. 8 illustrates a detailed view of a temperature control unit in FIG. 7.
Figure 9A:
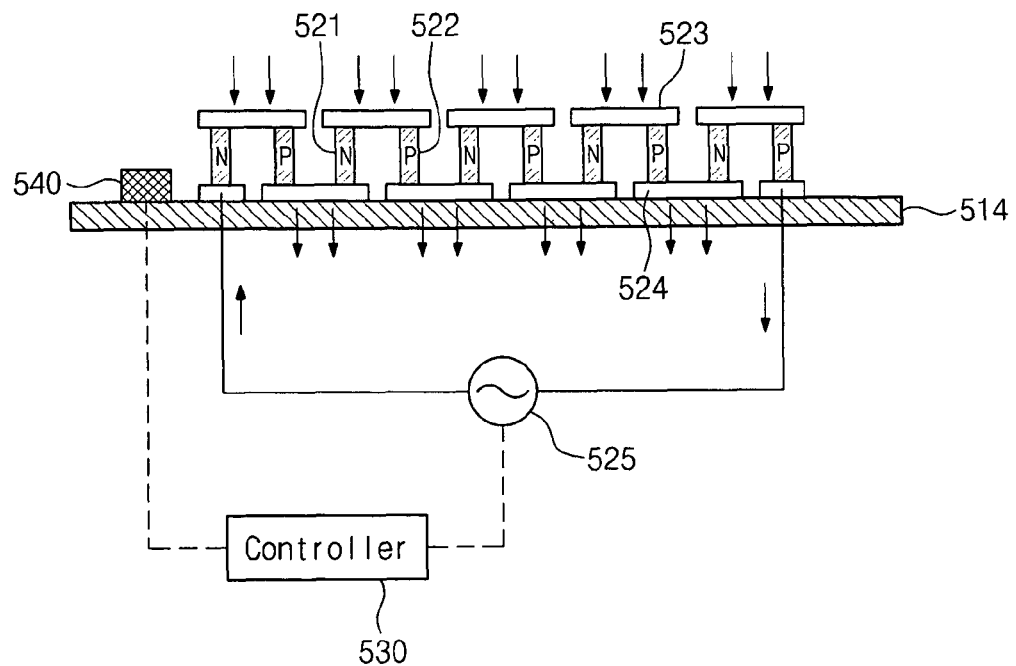
FIGS. 9A and 9B illustrate views of a thermoelectric module operation.
Figure 9B:
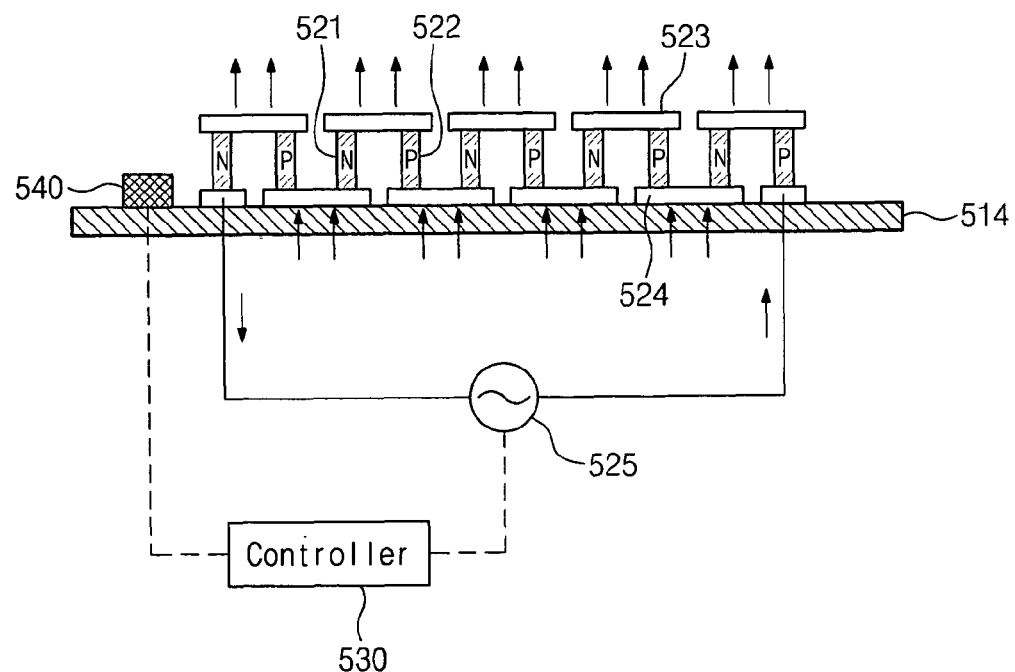

FIG. 8 illustrates a detailed view of the temperature control unit 500, and FIGS. 9A-9B illustrate operation of the temperature control unit 500. Referring to FIG. 8, the temperature control unit 500 may include a housing 510, a thermoelectric module 520, a temperature detector 540, a plate 550, and a blow fan 560.

The housing 510 may include an upper wall 512, a lower wall 514 disposed below the upper wall 512 and parallel to the upper wall 512, and a sidewall 516 extending from the upper wall 512 toward the lower wall 514. The thermoelectric module 520, the temperature detector 540, the plate 550, and the blow fan 560 may be disposed inside the housing 510. For example, the housing 510 may fit into the space 423 of the base 420, so the upper wall 512 may face the tester head 430 and the lower wall 514 may face the probe card 300.

The thermoelectric module 520 may be disposed on the lower wall 514 of the housing 510, e.g., the thermoelectric module 520 may be on an upper surface of the lower wall 514. The thermoelectric module 520 may include a plurality of thermoelectric devices 521 and 522 and first and second thermal plates 523 and 524 connecting the thermoelectric devices 521 and 522 to each other. For example, the plurality of second thermal plates 524 may be positioned on, e.g., directly on, the upper surface of the lower wall 514, and may be spaced apart from each other.

The thermoelectric devices 521 and 522 may be heated or cooled by a Peltier effect. The Peltier effect represents a phenomenon in which one junction portion is cooled and the other junction portion is heated when current flows into a circuit formed of two metals different from each other. At this time, the cooled portion and the heated portion are changed with each other when the current flow direction is changed.

The thermoelectric devices 521 and 522 may include N-type devices 521 and P-type devices 522. The N-type devices 521 and the P-type devices 522 may be alternately arranged in a first direction, i.e., a direction parallel to that of the lower wall 514. The thermoelectric devices 521 and 522 may be connected to each other by the first thermal plate 523 and the second thermal plate 524. The first thermal plate 523 may be connected to upper portions of the thermoelectric devices 521 and 522, and the second thermal plate 524 may be connected to lower portions of the thermoelectric devices 521 and 522. For example, the first thermal plate 523 may have one side connected to an upper end of a first N-type device 521 and the other side connected to an upper end of a first P-type device 522, i.e., a P-type device 522 adjacent to the first N-type device 521. The second thermal plate 524 may have one side connected to a lower end of the first P-type device 522 and the other side connected to a lower end of a second N-type device 521, i.e., the first P-type device 522 may be between the first and second N-type devices 521. In other words, the first thermal plates 523 may be offset with respect to the second thermal plates 524, i.e., one first thermal plate 523 may overlap portions of two adjacent second thermal plates 524, so a pair of first and second thermal plates 523 and 524 may share only one thermoelectric device, i.e., either one first N-type device 521 or one P-type device 522.

As illustrated in FIG. 8, a power supply 525 may be connected to the second thermal plate 524 disposed at a most left side of the thermoelectric module 520 and to the second thermal plate 524 disposed at a most right side of the thermoelectric module 520. The thermoelectric devices 521 and 522, the first and second thermal plates 523 and 524, and the power supply 525 may form one closed circuit. The power supply 525 may be a DC power. A controller 530 may be connected to the power supply 525, and may operate the power supply 525 for the current flow direction to be changed, i.e., to change a direction of the current applied from the power supply 525 into a clockwise direction CW or a counter-clockwise direction CCW.

Referring to FIG. 9A, current may be applied from the power supply 525 in the clockwise direction CW under the control of the controller 530. The current may be applied to the N-type device 521 disposed at the most left side of the N-type devices 521. Then, the current flows from the most left N-type device 521 to the adjacent P-type device 522 through the first thermal plate 523 and is applied to the next N-type device 521 through the second thermal plate 524. Thus, the current may flow through the plurality of the thermoelectric devices 521 and 522 via such successive operation. When based on the first thermal plate 523, current flows from the N-type device 521 to the P-type device 522, and the first thermal plate 523 may be cooled by the Peltier effect. When based on the second thermal plate 524, current flows from the P-type device 522 to the N-type device 521, and the second thermal plate 524 may be heated by the Peltier effect. Thus, the first thermal plate 523 may absorb heat, and the second thermal plate 524 may radiate heat.

Referring to FIG. 9B, current may be applied from the power supply 525 in the count-clockwise direction CCW under the control of the controller 530. The current may be applied to the P-type device 522 disposed at the most right side of the P-type devices 522. Then, the current flows from the right-most P-type device 522 to the adjacent N-type device 521 through the first thermal plate 523 and is applied to the next P-type device 522 through the second thermal plate 524. Thus, the current flows through the plurality of the thermoelectric devices 521 and 522 via such successive operations. When based on the first thermal plate 523, current flows from the P-type device 522 to the N-type device 521, and the first thermal plate 523 is heated by the Peltier effect. When based on the second thermal plate 524, current flows from the N-type device 521 to the P-type device 522, and the second thermal plate 524 is cooled by the Peltier effect. Thus, the first thermal plate 523 may radiate heat, and the second thermal plate 524 may absorb heat.

Referring again to FIG. 8, the temperature detector 540 of the temperature control unit 500 may be disposed on, e.g., directly on, the upper surface of the lower wall 514, i.e., a surface facing an interior of the housing 510. The temperature detector 540 may detect a temperature of the lower wall 514 of the housing 510. As described above, when the probe card 300 (FIG. 7) is coupled to the base 420 (FIG. 7), the probe card 300 may contact the temperature control unit 500. Therefore, the lower wall 514 of the housing 510 of the temperature control unit 500 may contact, e.g., directly contact, the reinforcement member 320 (FIG. 7) of the probe card 300. For example, the lower wall 514 and the reinforcement member 320 may directly contact and overlap each other, to have flush surfaces. Thus, the temperature detector 540 may measure the temperature of the lower wall 514 of the housing 510 contacting the probe card 300, and may detect, e.g., estimate, a temperature of the probe card 300 based on the measured, e.g., detected, temperature of the lower wall 514. For example, as the temperature detector 540 may be in direct contact with the lower wall 514, and the lower wall 514 may directly contact the reinforcement member 320, e.g., via an entire upper surface of the reinforcement member 320, the temperature detector 540 may detect the temperature of the probe card 300 substantially accurately.

The controller 530 may be connected to the temperature detector 540. The controller 530 may generate a control signal corresponding to a detection signal of the temperature detector 540, i.e., corresponding to the temperature of the reinforcement member 320 detected by the temperature detector 540, to apply the control signal to the power supply 525 of the thermoelectric module 520, thereby changing a power flow direction of the power supply 525.

For example, when a temperature of the probe card 300 is lower than a reference temperature in the EDS process, a temperature of the lower wall 514 of the housing 510 contacting the probe card 300 may be decreased. That is, the detection signal of the temperature detector 540 may be transmitted to the controller 530. When the temperature of the probe card 300, i.e., corresponding to the detection signal of the temperature detector 540, detected by the temperature detector 540 is lower than the reference temperature in the EDS process, the controller 530 may change a power flow direction of the power supply 525 into the clockwise direction CW to heat the second thermal plate 524 of the thermoelectric module 520, as illustrated in FIG. 9A. Heat of the heated second thermal plate 524 is transferred to the lower wall 514 of the housing 510, and the heat transferred to the lower wall 514 may be transferred to the probe card 300 contacting the lower wall 514 in order to maintain the probe card 300 at a desired temperature. This process may be continuously performed until the temperature detected by the temperature detector 540 increases to the reference temperature. Thus, the probe card 300 may be maintained at a constant temperature.

In another example, when a temperature of the probe card 300 is higher than the reference temperature in the EDS process, a temperature of the lower wall 514 of the housing 510 contacting the probe card 300 may be increased. That is, the detection signal of the temperature detector 540 may be transmitted to the controller 530, and the controller 530 may change a power flow direction of the power supply 525 into the count-clockwise direction CCW to cool the second thermal plate 524 of the thermoelectric module 520, as illustrated in FIG. 9B. Heat of the lower wall 514 of the housing 510 may be removed to the cooled second thermal plate 524, thereby causing removal of excess heat from the probe card 300. This process may be continuously performed until the temperature detected by the temperature detector 540 decreases to the reference temperature. Thus, the probe card 300 may be maintained at the constant temperature.

As described above, when the probe card 300 is maintained at a substantially constant temperature, thermal deformation of the probe card 300 and the probe needles 332 may be minimized. Therefore, the probe needles 332 of the probe card 300 may uniformly contact the semiconductor devices.

When the thermoelectric module 520 is operated as shown in FIG. 9B, the first thermal plate 523 may be heated. The plate 550 may be disposed on the thermoelectric module 520, i.e., on top surfaces of the first thermal plates 523, and may function as a heat sink to remove, i.e., radiate, heat generated in the first thermal plate 523. The plate 550 may be formed of a material having superior heat transfer efficiency. For example, the plate 550 may be formed of a metallic material. A plurality of grooves 552 may be formed in a top surface of the plate 550 to increase a contact area between the plate 550 and ambient air, thereby improving the heat transfer efficiency.

The blow fan 560 for cooling the plate 550 may be disposed above the plate 550. The temperature control unit 500 may include one or more blow fans 560, as illustrated in FIG. 8. The blow fan 560 may exhaust the relatively high-temperature ambient air around the plate 550 through an exhaust hole 518 of the housing 510 to cool the plate 550.

Figure 10:
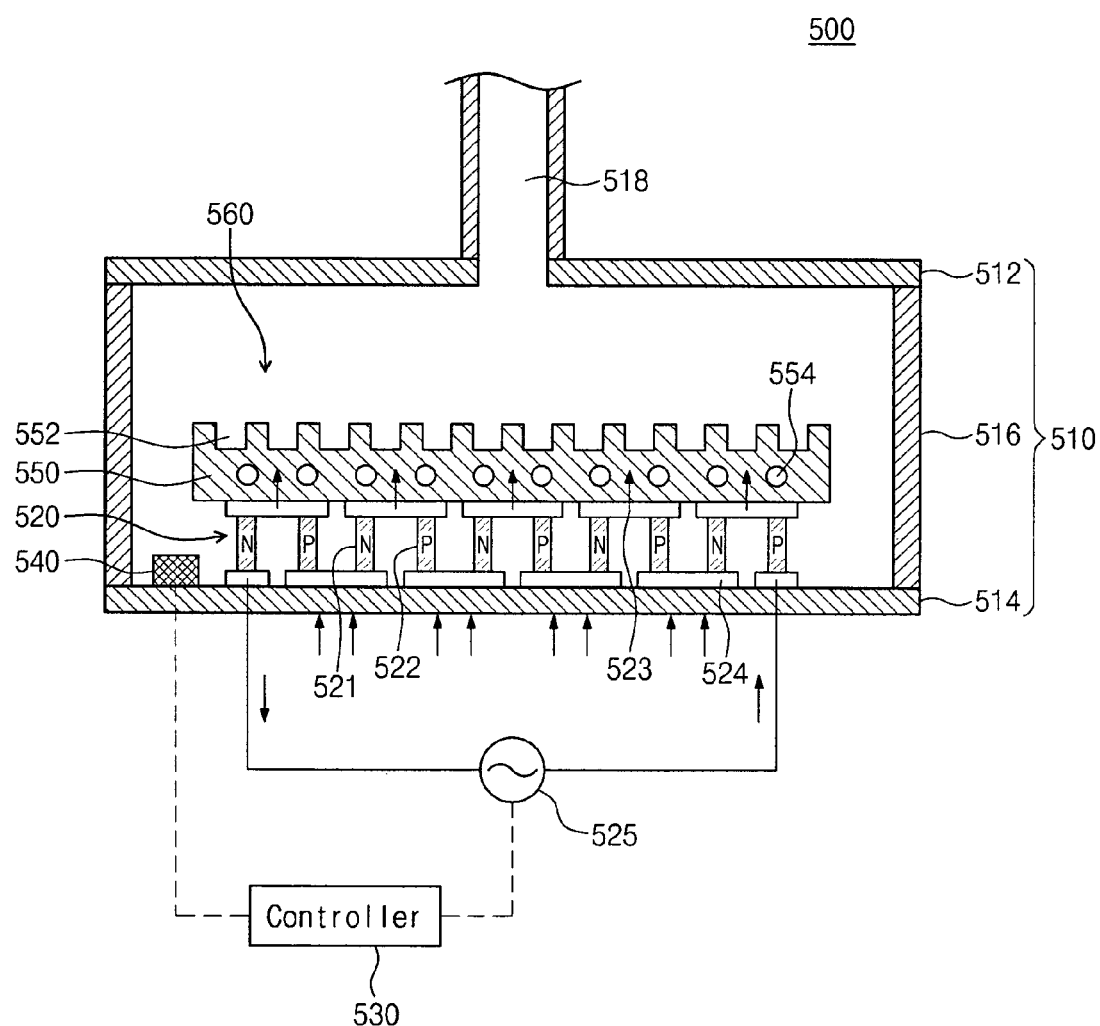
FIGS. 10 and 11 illustrate views of other exemplary embodiments of a temperature control unit.

Various units for cooling the plate 550 may be provided except the blow fan 560. For example, as illustrated in FIG. 10, a cooling line 554 through which a coolant flows may be provided in the plate 550.

Figure 11:
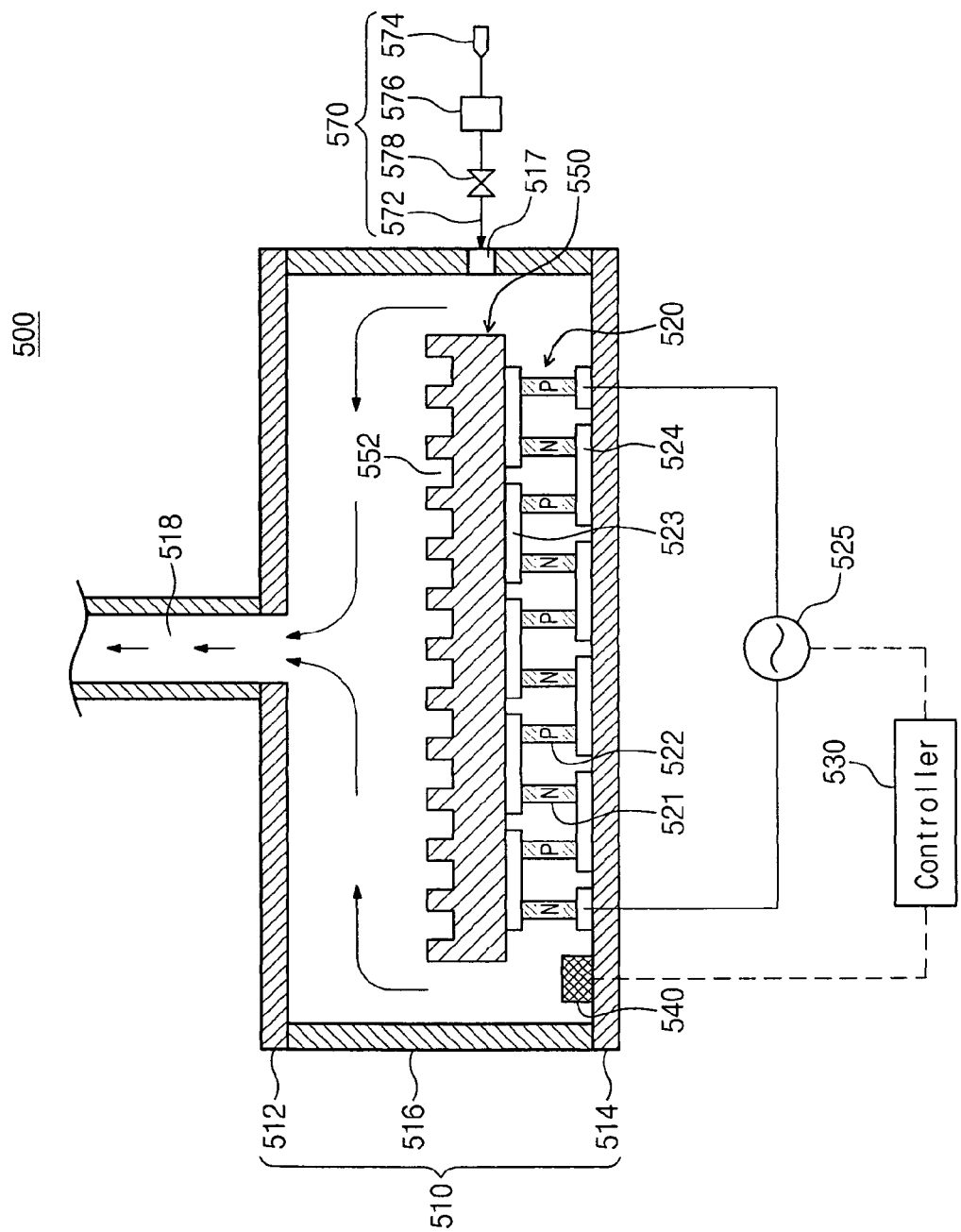

In another example, as further illustrated in FIG. 11, a cooling air supply member 570 for supplying cooling air into the housing 510 may be provided. The cooling air supply member 570 may include an air supply tube 572 connected to an inlet port 517 of the sidewall 516 of the housing 510. An air supply source 574 may be connected to the other end of the air supply tube 572. A cooler 576 for cooling air and a valve 578 for controlling an air flow may be disposed on the air supply tube 574. The cooling air supplied from the cooling air supply member 570 to the housing 510 may cool the plate 550, and may be exhausted through the exhaust hole 518 of the housing 510.

According to example embodiments, an apparatus for testing electrical properties of a semiconductor device may include a temperature control unit 500 configured to control temperature of the probe card 300, thereby preventing or substantially minimizing thermal deformation of the probe card 300 when temperature conditions during testing are high/low. As such, the probe needles 322 of the probe card 300 may uniformly contact the electrode pads 5 of the semiconductor devices 1, thereby providing improved operability and reliability of the apparatus.

Exemplary embodiments have been disclosed herein, and although specific terms are employed, they are used and are to be interpreted in a generic and descriptive sense only and not for purpose of limitation. Accordingly, it will be understood by those of ordinary skill in the art that various changes in form and details may be made without departing from the spirit and scope of the present invention as set forth in the following claims.

What is claimed is:

1. An apparatus for testing an electrical property of a semiconductor device, comprising:
a substrate support unit;
a tester head above the substrate support unit, the tester head including a base;
a probe card connected to the base of the tester head;
a temperature control unit within the base of the tester head, the temperature control unit being configured to control temperature of the probe card by heat transfer with the probe card, the temperature control unit including:
a thermoelectric module configured to change a heat flow direction according to a power flow direction, the thermoelectric module being within the base of the head tester to exchange heat with the probe card,
a plate on the thermoelectric module configured to radiate or absorb heat according to a change of the heat flow direction of the thermoelectric module;
a power supply,
a temperature detector within the base, the temperature detector being configured to detect the temperature of the probe card and to generate a corresponding detection signal,
a controller configured to generate a control signal corresponding to the detection signal of the temperature detector and to apply the generated control signal to the power supply to change a power flow direction of the power supply, and
a housing, the thermoelectric module, the plate, and the temperature detector being inside the housing; and
an elastic member between the base of the tester head and the housing, the elastic member being configured to apply an elastic force to push down the housing.

2. The apparatus as claimed in claim 1, wherein the temperature control unit further comprises:
at least one blow fan above the plate; and
at least one exhaust hole in the housing, the exhaust hole being configured to exhaust air blown by the blow fan.

3. The apparatus as claimed in claim 1, wherein the temperature control unit further comprises:
a cooling air supply member configured to supply cooling air into the housing; and
an exhaust hole in the housing, the exhaust hole being configured to exhaust the cooling air supplied into the housing.

4. The apparatus as claimed in claim 1, further comprising a cooling line through the plate for a coolant.

5. The apparatus as claimed in claim 1, further comprising a plurality of grooves in the plate, the grooves having contact with ambient air.

6. The apparatus as claimed in claim 1, wherein the temperature control unit is enclosed between the probe card and the base of the tester head.

7. The apparatus as claimed in claim 6, wherein the probe card and the base of the tester head are coupled to each other to define a volumetric space therebetween, the temperature control unit being entirely within the volumetric space.

8. The apparatus as claimed in claim 7, wherein the temperature control unit is in a housing, the housing being enclosed in the volumetric space, and a bottom wall of the housing being flush with the probe card.

9. The apparatus as claimed in claim 7, wherein a portion of the probe card is in the volumetric space, the portion of the probe card contacting the temperature control unit.

10. The apparatus as claimed in claim 1, wherein the temperature detector and the thermoelectric module are positioned directly on a same surface.

11. The apparatus as claimed in claim 10, wherein the temperature detector is configured to directly measure a temperature of a surface which directly contacts the thermoelectric module.

12. An apparatus for testing an electrical property of a semiconductor device, comprising:
- a substrate support unit;
- a tester head above the substrate support unit, the tester head including a base, the base of the tester having a cylindrical shape with an open lower portion;
- a probe card connected to the base of the tester head, the probe card being coupled to the base to close the open lower portion; and
- a temperature control unit within the base of the tester head, the temperature control unit being configured to control temperature of the probe card by heat transfer with the probe card,
- wherein the temperature control unit includes:
    - a housing within the base, a bottom wall of the housing contacting the probe card,
    - a thermoelectric module in the housing and configured to change a heat flow direction according to a power flow direction, the bottom wall of the housing being between the thermoelectric module and the probe card,
    - a plate on the thermoelectric module and configured to radiate or absorb heat according to a change of the heat flow direction of the thermoelectric module, the thermoelectric module being between the plate and the bottom wall of the housing,
    - a temperature detector configured to detect a temperature of the bottom wall of the housing and to generate a detection signal reflecting a temperature of the probe card in accordance with the detected temperature of the bottom wall, and
    - a controller configured to generate a control signal corresponding to the detection signal of the temperature detector and to apply the control signal to a power supply of the thermoelectric module to change a power flow direction of the power supply.

* * * * *